(12) United States Patent
Cui et al.

(10) Patent No.: US 9,522,821 B2
(45) Date of Patent: Dec. 20, 2016

(54) METHOD OF FABRICATING NANO-SCALE STRUCTURES AND NANO-SCALE STRUCTURES FABRICATED USING THE METHOD

(71) Applicants: Bo Cui, Waterloo (CA); Ripon Kumar Dey, Waterloo, CA (US)

(72) Inventors: Bo Cui, Waterloo (CA); Ripon Kumar Dey, Waterloo, CA (US)

( * ) Notice: Subject to any disclaimer, the term of this patent is extended or adjusted under 35 U.S.C. 154(b) by 0 days.

(21) Appl. No.: 14/785,338

(22) PCT Filed: Apr. 9, 2014

(86) PCT No.: PCT/CA2014/050363
§ 371 (c)(1),
(2) Date: Oct. 17, 2015

(87) PCT Pub. No.: WO2014/169383
PCT Pub. Date: Oct. 23, 2014

(65) Prior Publication Data
US 2016/0068384 A1 Mar. 10, 2016

Related U.S. Application Data

(60) Provisional application No. 61/854,110, filed on Apr. 18, 2013.

(51) Int. Cl.
| | |
|---|---|
| *H01L 21/00* | (2006.01) |
| *B81C 1/00* | (2006.01) |
| *H01L 21/311* | (2006.01) |
| *H01L 21/3065* | (2006.01) |
| *H01L 21/3213* | (2006.01) |

(Continued)

(52) U.S. Cl.
CPC ............ *B81C 1/00111* (2013.01); *B81B 1/008* (2013.01); *H01L 21/3065* (2013.01); *H01L 21/31144* (2013.01); *H01L 21/32134* (2013.01); *H01L 21/32139* (2013.01); *B81B 2201/12* (2013.01); *B81B 2203/0361* (2013.01); *B81C 2201/0132* (2013.01); *B81C 2201/053* (2013.01); *B82Y 30/00* (2013.01); *B82Y 40/00* (2013.01); *G01Q 70/12* (2013.01)

(58) Field of Classification Search
CPC ............ H01L 21/3065; H01L 21/31144; H01L 21/32139; H01L 21/32134
See application file for complete search history.

(56) References Cited

U.S. PATENT DOCUMENTS

| | | |
|---|---|---|
| 4,968,585 A | 11/1990 | Albrecht et al. |
| 5,242,541 A | 9/1993 | Bayer et al. |

(Continued)

*Primary Examiner* — Ngan Ngo

(57) ABSTRACT

The invention provides a fabrication method of batch producing nano-scale structures, such as arrays of silicon pillars of high aspect ratio. The invention also relates to providing arrays of high aspect ratio silicon pillars fabricated using the improved fabrication method. The array of silicon pillars is fabricated from arrays of low aspect ratio pyramid-shaped structures. Mask formed from a hard material, such as a metal mask, is formed on top of each of the pyramid-shaped structures in a batch process. The pyramid-shaped structures are subsequently etched to remove substrate materials not protected by the hard masks, so that a high aspect ratio pillar or shaft is formed on the pyramid-shaped low aspect ratio base, resulting in an array of high aspect ratio silicon pillars.

31 Claims, 7 Drawing Sheets

(51) Int. Cl.
  *B81B 1/00*   (2006.01)
  *B82Y 40/00*   (2011.01)
  *G01Q 70/12*   (2010.01)
  *B82Y 30/00*   (2011.01)

(56) References Cited

U.S. PATENT DOCUMENTS

| | | | |
|---|---|---|---|
| 5,611,942 A * | 3/1997 | Mitsui | B82Y 35/00 216/11 |
| 6,091,124 A * | 7/2000 | Bayer | B82Y 35/00 250/306 |
| 6,743,211 B1 * | 6/2004 | Prausnitz | A61B 5/1411 424/449 |
| 6,930,307 B2 | 8/2005 | Takazawa et al. | |
| 7,022,541 B1 | 4/2006 | Yenilmez et al. | |
| 7,370,515 B2 | 5/2008 | Okulan et al. | |
| 7,388,199 B2 | 6/2008 | Morimoto et al. | |
| 7,534,686 B2 * | 5/2009 | Lee | H01L 21/26586 438/197 |
| 7,703,147 B2 | 4/2010 | Park et al. | |
| 7,843,000 B2 * | 11/2010 | Yu | H01L 29/66795 257/330 |
| 7,847,207 B1 | 12/2010 | Chow et al. | |
| 8,354,320 B1 * | 1/2013 | Xie | H01L 29/66795 438/279 |
| 9,330,910 B2 * | 5/2016 | Chen | H01L 21/02612 |
| 2004/0036403 A1 | 2/2004 | Ono et al. | |
| 2008/0061383 A1 * | 3/2008 | Kawakita | H01L 29/511 257/410 |
| 2008/0098805 A1 | 5/2008 | Jin et al. | |
| 2009/0205092 A1 | 8/2009 | Wang et al. | |
| 2013/0049150 A1 * | 2/2013 | Hong | H01L 31/035281 257/431 |
| 2013/0056826 A1 * | 3/2013 | Liu | H01L 21/823431 257/347 |
| 2013/0221448 A1 * | 8/2013 | Chang | H01L 29/06 257/401 |
| 2013/0244392 A1 * | 9/2013 | Oh | H01L 29/66477 438/299 |
| 2013/0298977 A1 * | 11/2013 | Chen | B82Y 30/00 136/255 |
| 2014/0099539 A1 * | 4/2014 | Yamazaki | H01M 4/386 429/211 |
| 2014/0117307 A1 * | 5/2014 | Herner | H01L 33/0095 257/13 |
| 2014/0138620 A1 * | 5/2014 | Svensson | H01L 33/007 257/13 |
| 2014/0312471 A1 * | 10/2014 | Hong | H01L 29/06 257/632 |
| 2015/0011093 A1 * | 1/2015 | Singh | H01J 37/32422 438/712 |
| 2015/0069474 A1 * | 3/2015 | Ching | H01L 29/7842 257/288 |
| 2015/0236015 A1 * | 8/2015 | Jeong | H01L 27/0886 257/401 |
| 2016/0041095 A1 * | 2/2016 | Rothberg | G01N 21/6408 506/4 |
| 2016/0218012 A1 * | 7/2016 | Shimamoto | H01L 21/02164 |
| 2016/0225764 A1 * | 8/2016 | Chang | H01L 27/0886 257/401 |

\* cited by examiner (A)

(B)

(C)

METHOD OF FABRICATING NANO-SCALE STRUCTURES AND NANO-SCALE STRUCTURES FABRICATED USING THE METHOD

FIELD OF INVENTION

The invention relates generally to the field of fabrication of nano-scale structures. In particular, the invention relates to fabrication of arrays of nano-scale pillars of high aspect ratio on a wafer and such manufactured arrays fabricated using an improved fabrication method.

BACKGROUND OF INVENTION

Devices and structures at nano-scales are becoming increasingly useful. Manufacturing such structures efficiently however remains challenging.

For example, it is known to fabricate high aspect ratio atomic force microscope ("AFM") tips (also popularly known as "AFM probes") using focused ion beam ("FIB") to "machine" the tips one by one. This method is versatile and is not limited to producing AFM probes. However, because each probe is fabricated individually, it is a slow and costly process. It is also known to fabricate a high aspect ratio AFM probe by attaching or growing a carbon nanotube at the apex of a low aspect ratio base (which may be a low aspect ratio probe itself). However, it is very challenging to attach or grow a carbon nanotube at a precisely desired position with a fixed direction and length. It also may be a challenge to scale up the carbon nanotube process.

AFM technology is becoming increasingly mature and more and more routinely used in advanced research and industrial research and development laboratories. AFM probe is a consumable. A demand therefore exists for more uniformly manufactured and low cost AFM probes.

To achieve the required atomic or molecular scale resolution, an AFM probe itself also must have a thickness of comparable scale. AFM probe is only one example to illustrate the need for providing manufactured articles that are of nano-scale. Here, nano-scale articles generally refer to articles of which at least one of the structural dimensions, such as width, radius, thickness and the like, is more appropriately measured in nanometers, i.e., generally at the atomic and molecular scales and commonly in the general range of one nanometer to no more than a few hundred nanometers. More and more products are miniaturized which requires more nano-scale structures to be manufactured in a more efficient and reproducible manner.

The foregoing creates challenges and constraints for providing a more efficient method of fabricating nano-scale structures and devices and, in particular, providing pillar-like structures with high aspect ratio manufactured using such efficient and reproducible methods. It is an object of the present invention to mitigate or obviate at least one of the above mentioned disadvantages.

SUMMARY OF INVENTION

The present invention is directed to fabrication of nano-scale structures. A broad aspect of the present invention involves a batch process for fabricating nano-scale structures, in particular, an array of silicon pillars formed on a silicon substrate, with an aspect ratio of 5 or larger.

To manufacture multiple or an array of high aspect ratio pillar-like structures simultaneously or in a batch process, the method starts from a silicon (Si) substrate that has formed thereon multiple or an array of protuberances in the shape of pyramids. Such pyramids may be formed from etching a flat Si substrate, thus resulting in pyramids with sidewalls mostly aligned with Si {111} crystal planes. Of course, a different substrate material may be used or the pyramids may be sharpened, so the sidewalls also may be steeper than that defined by Si {111} crystal planes. The top of the pyramid-shaped protuberances is first covered with a hard material or hard materials. To cover the top of these pyramids, a two-step process is employed, namely to form first a protective layer of a hard material or hard materials to cover each pyramid, covering at least its apex surface, and then remove the protective layer of hard material or materials from sidewalls of the pyramid to expose the sidewalls but not the top, as will be explained later. The pyramid is next etched, with the hard material covering the pyramid apex area as a mask, thus forming a shaft extending downward from the apex area, the shaft having a cross-sectional profile defined by the shape of the hard material mask on the top. The hard material mask may be removed at a final step.

In a first aspect of the invention, there is provided a method of fabricating a plurality of pillar-like structures on a substrate. The substrate has a plurality of protuberances formed thereon, each of the protuberances having an apex and sidewalls extending downward from the apex area. The method includes the steps of covering each protuberance of the plurality of protuberances with a protective layer of mask material to cover at least the apex of the each protuberance, removing the protective layer of mask material from sidewalls of the each protuberance to expose the sidewalls and leave an island of the mask material covering the apex to form a mask on the apex of the each protuberance, and etching each of the protuberances anisotropically with an etchant gas in a batch process to form the plurality of pillar-like structures, each pillar-like structure being etched from one of the protuberances and having a shaft extending from the mask towards the substrate, the shaft having along its length a transverse cross-sectional shape substantially defined by the shape of the mask.

In a feature of this aspect of the invention, a plasma process, such as an ICP-RIE process, is employed for the etching of the each protuberance. The substrate material may be silicon. An example mask material may be Cr, which can be evaporation coated and then removed from the sidewalls by physical sputtering with Ar ions. Alternatively, the mask material may be Al and the $Cl_2$ or $BCl_3$ can be used in the ICP-RIE process to remove the coated Al from the sidewalls. In general, the mask material may be a suitable metal, such as Cr, Ti, Ni, and Al, or non-metal, such as $SiO_2$.

In another feature of the aspect of the invention, the method includes the further steps of covering each of the plurality of protuberances with a layer of second mask material after covering the plurality of protuberances with the mask material, the layer of second mask material covering at least the mask material that covers the apex of the each protuberance, and removing the layer of second mask material from sidewalls of the each protuberance to expose sidewalls covered by the second mask material after removing the mask material from the sidewalls. The mask material and the mask material pair may be either Cr/Ti or Al/Si. The second mask material may be one that is more resistive to removal than the mask material with respect to a gas ion used for removing the mask material from sidewalls of the pyramids, or the second mask material may be coated thicker.

In a second aspect, there is provided a method of fabricating a nano-scale structure on a substrate. The substrate has at least one protuberance formed thereon, the at least one protuberance having a top surface defining the shape of the nano-scale structure and sloped sidewalls extending downward from the top surface. The method includes the steps of covering the at least one protuberance with a protective layer of mask material to cover at least the top surface, removing the protective layer of mask material from sidewalls of the at least one protuberance to expose the sidewalls and to form a mask covering the top surface of the at least one protuberance, simultaneously etching the sloped sidewalls of the at least one protuberance anisotropically with an etchant gas to form substantially vertical walls extending from the mask toward the substrate, each of the substantially vertical walls being etched from one of the sloped sidewalls.

In yet another aspect of the invention, there is provided an array of silicon pillars formed on a silicon substrate. Each of the silicon pillars is unitarily formed from the substrate. Each silicon pillar comprises an apex spaced from the substrate, a base integrally formed on the substrate, and a shaft extending between the apex and the base, the shaft having a transverse cross-sectional shape substantially the same along its length. The shaft has a shaft aspect ratio that is larger than the base's aspect ratio.

The shaft may be tapered towards the apex, or the shaft may be thinner in a middle section than either end of the shaft. The array may have a relatively high density, such as a density of at least 480 silicon pillars per 100 $cm^2$.

In other aspects the invention provides various combinations and subsets of the aspects described above.

BRIEF DESCRIPTION OF DRAWINGS

For the purposes of description, but not of limitation, the foregoing and other aspects of the invention are explained in greater detail with reference to the accompanying drawings, in which.

DETAILED DESCRIPTION OF EMBODIMENTS

Figure 1:
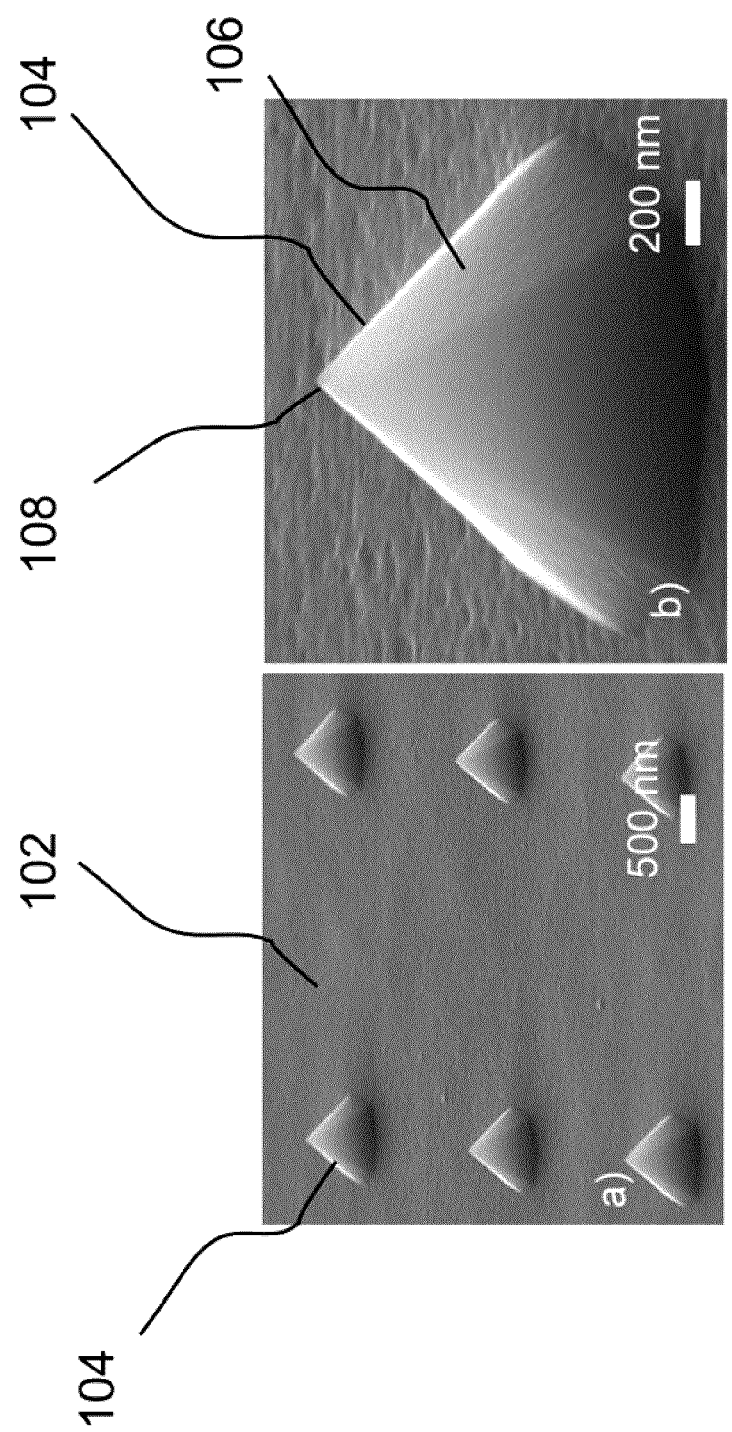
FIG. 1 shows photographs of silicon substrate having formed thereon an array of pyramid-shaped protuberances and details of a pyramid-shaped protuberance.

The description which follows and the embodiments described therein are provided by way of illustration of an example, or examples, of particular embodiments of the principles of the present invention. These examples are provided for the purposes of explanation, and not limitation, of those principles and of the invention. In the description which follows, like parts are marked throughout the specification and the drawings with the same respective reference numerals.

The present invention relates to a method of fabricating nano-scale structures and arrays of silicon pillars manufactured using this improved method. Referring to FIG. 1, to manufacture an array of silicon pillars on a flat wafer with high aspect ratio shaft, the method starts from an Si substrate 102 that has formed thereon multiple or an array of protuberances 104 in the shape of pyramids. Such pyramids 104 may be formed from, for example, etching a flat Si substrate, thus resulting in pyramids with sidewalls 106. The top 108 of the pyramid-shaped protuberances is first covered with a hard material or hard materials. Here, by the word "hard", it is meant that the material is resistive to the etching with sufficiently high selectivity (e.g., at least 1:10) against the substrate/pyramid material, here silicon, i.e., the mask material is etched away far more slowly (10 times slower in this example) than the substrate material. As will be appreciated, the selectivity is relative and depends on the gas to be used for the etching process, the substrate material and the mask material. If a different material is used for substrate or if a different gas is used for etching, the selectivity of the mask material also may be different. To cover the top of these pyramids, a two-step process is employed, namely to form a protective layer over a pyramid with a hard material or hard materials, covering at least the apex, and then remove the hard material or materials from sidewalls 106 of the pyramid 104 to expose the sidewalls, but still covering the apex 108, as will be explained later. The pyramid is next etched, with the hard material covering the pyramid apex area as a mask 110, thus forming a shaft 112 extending downward from the apex area 108 and terminating at a low aspect ratio base 114 to form a pillar, the shaft having a cross-sectional shape defined by the shape of the hard material mask 110 on the top, as can be seen in the photographs shown in FIG. 2 and illustrated in FIG. 3. The hard material mask 110 may be removed at a final step. This process is further described in detail below.

The process of fabricating multiple or an array of silicon pillars in a batch process starts with forming masks 110 on top surface of a substrate 102 that has multiple or an array of protuberances 104 already formed thereon. As shown in FIG. 1, these protuberances 104 have the shape of pyramids. Conveniently, these pyramids may be formed in an etching step, as will be described later, from a flat substrate. However, any other suitable methods may be employed to form these pyramids. Indeed, any substrate with such array of pyramids already formed thereon may be used for fabricating silicon pillars using the method described herein. In the case of a silicon substrate, these pyramids have sidewalls that are generally aligned with {111} crystal planes of silicon. Accordingly, the angle α between any sidewall and the symmetry axis of the pyramid is generally around 30 to 40 degrees (the theoretical values is 35.3 degrees). Some commercially available arrays of silicon pyramids may have sharpened the pyramid top or used modified silicon etching process and the angle α may be smaller than 30 degrees. For manufacturing a nano-scale product, a different substrate material may also be used, which may also lead to a different angle α. In general, though, a is at least about 15 degrees. This is for a practical reason. A probe tip with high aspect ratio has a very small α. If α is already small, then no further processing would be necessary, including processing using the fabrication method described herein. On the other hand, when a is close to 90 degrees, the "pyramid" would be very flat. It is generally expected that the angle α is between 15 and 40 degrees.

Any suitable method of forming a hard mask on top surfaces of these pyramids may be employed. Two different approaches are described in detail herein. Each of these involves a batch process, namely, applying the process to all pyramids at the same time, or even simultaneously, thus forming the hard masks in a batch, rather than one by one on each of the pyramids. According to one method of forming hard masks 110, a protective layer of hard or mask material is first formed over all pyramids 104 in the array, simultaneously or in a batch process. The protective, hard mask material can be metal, such as chromium (Cr), titanium (Ti), nickel (Ni), copper (Cu) or aluminum (Al), or non-metal, such as silicon dioxide ($SiO_2$), and then the protective layer of mask material is removed from sidewalls 106 of these pyramids, thus leaving islands of layer of mask material covering only the top surfaces 108 of these pyramids, to form the hard masks. This is described in an example in detail below, in reference to FIGS. 4A to 4D.

Figure 4:
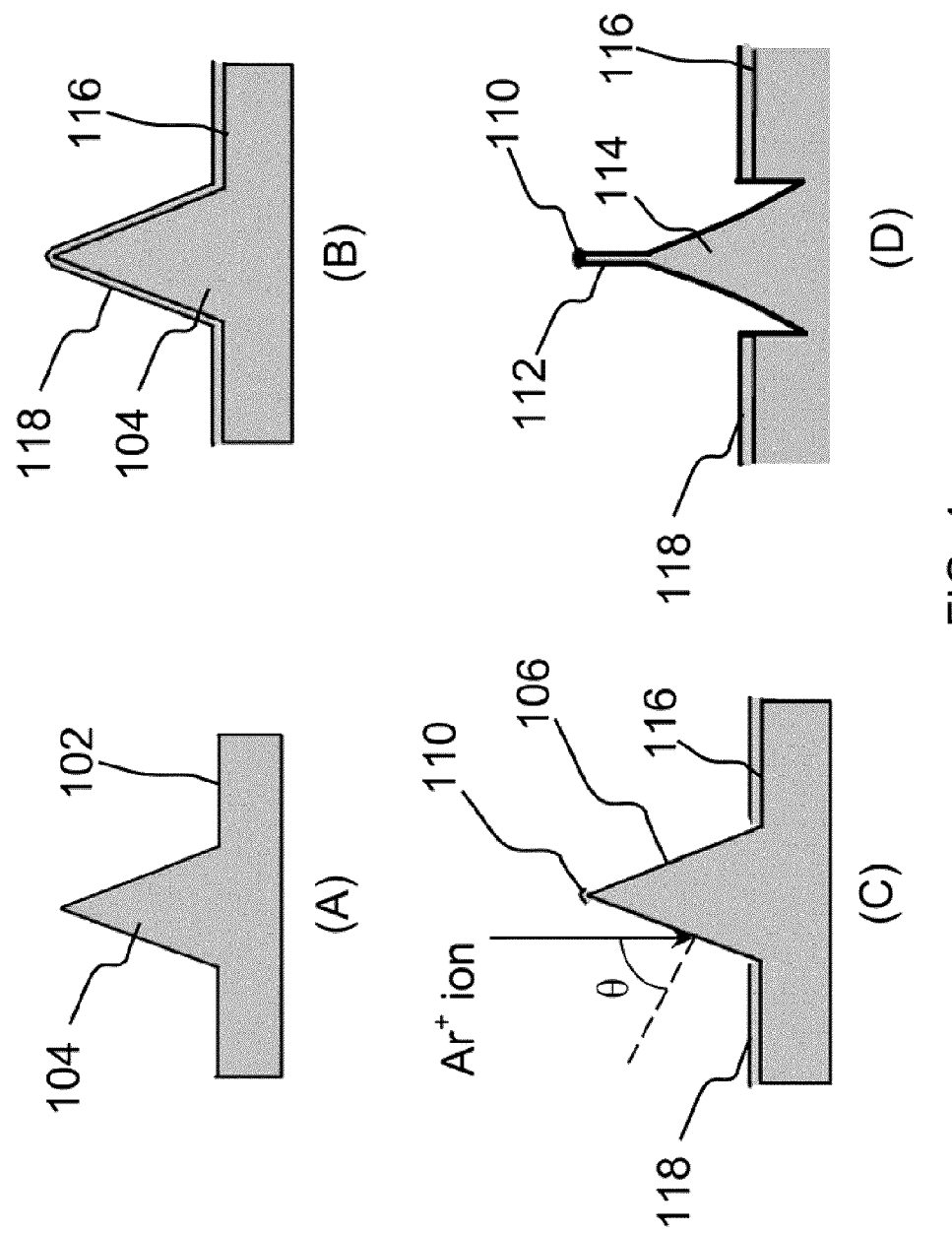
FIGS. 4A, 4B, 4C and 4D are diagrams illustrating steps of fabricating a silicon pillar in accordance with the fabrication method of the present invention.

In this example, a thin layer (~10 nm) of Cr is first evaporation coated onto the silicon substrate 102 (FIG. 4A). The protective layer in general can be formed using physical vapor deposition (notably evaporation, sputter deposition, pulsed laser deposition, among others) or chemical vapor deposition, or even by thermal oxidization of the silicon tip material (e.g., to form a $SiO_2$ mask as described below). The coating may or may not be directional, depending on the coating method used. In general, the pyramids 104 and the flat surfaces 116 of the substrate 102 between pyramids tend to be covered with a mask layer 118 (FIG. 4B), too. Although generally each pyramid tends to be fairly well covered with the mask layer, only the apex area is required to be covered, as will become clear later.

Next, the protective layer of coated Cr is removed from the sidewalls 106 of the pyramids to expose the sidewalls but not the apex area of the pyramid structure (FIG. 4C). The removal is performed through reactive ion etching ("RIE") using Ar gas. Only the Cr coated on the sidewalls 106 is removed. The RIE process with an inert gas such as Ar uses physical bombardment only, with only insignificant or no chemical reaction; in other words, the physical process is important and, in this case, dominates the chemical reactive process. This is achieved by using an inert gas such as Ar and appropriately adjusting the incidence energy of Ar ions. Ar ions are accelerated toward the substrate in a general downward direction, as shown in FIG. 4C, i.e., along directions within about 10 degrees from the symmetry axis of the pyramid structure. Thus, the incidence angle θ of Ar ion stream with the surface of sidewalls 106, namely the angel between the direction of the ion stream and the normal direction of the sidewalls, is generally (90−α) degrees. As is known to one skilled in the art, yield of sputtering with Ar gas varies with ion incidence angle θ. The yield peaks at about 60 to 70 degrees, about 2 to 3 times higher than the yield at normal incidence angle, namely zero degree. Due to the angle-dependent sputtering yield, Cr coated on the sidewalls is more easily removed than that coated on the apex, where the incident Cr stream has roughly zero incidence angle. In addition, the coating on sidewalls also tends to be thinner, thus also more easily removed. In this example, RIE for angle dependent Cr etch uses the following recipe:

Ar: 10 sccm, P: 7 mT, RF: 300 w, for 4 min

Here, "sccm" stands for standard cubic centimeter per minute and "mT" means milli-torr. In this example, etching rate of Cr with Ar gas was found to be around 2 nm/min. With appropriate selection of etching time (in this example, a few minutes) to match this etching rate, the Cr coating on pyramid sidewalls is completely removed while an island of coated Cr layer is left to cover the apex 108, thus forming the mask 110 on apex 108.

Although RIE etching with Ar gas is described here, any suitable method that removes the protective layer of Cr from sidewalls to expose the sidewalls, yet leaving an island layer covering the apex, may be employed. For example, to remove the protective layer from sidewalls, in addition to the RIE or ICP-RIE method described herein, ion milling (pure physical sputtering process, using inert gas such as Ar) or chemically assisted ion beam etching ("CAIBE", adding reactive gas such as $Cl_2$ to Ar) also can be used. In contrast to the RIE or ICP-RIE method, which is carried out in a gas environment with pressure 1-100 mTorr, ion milling and CAIBE are generally carried out in near vacuum (i.e., far below mTorr pressure). For RIE, the selection of the added reactive gas is that it should be able to etch the mask material. For example, one may use $Cl_2$ or $BCl_3$ for etching Al, and use $Cl_2/O_2$ for etching Cr. ICP power may also be added to RF power (in an ICP-RIE process) to increase the etching rate.

Of course, one only needs to form a protective layer to cover each of the pyramids with mask material(s). Any methods of forming a protective layer may be used, provided the layer can be removed from sidewalls yet still leaving an island covering the apex area. More particularly, forming the protective layer is not restricted to the coating method described above. For example, the protective layer may also be formed by growing a protective layer from material of the pyramids themselves. One may start from a silicon substrate 102 that are formed thereon a plurality of pyramids 104, such as that illustrated in FIG. 1. Then, a layer of oxide, for example, with a thickness of about 20 nm to 200 nm, as desirable or as required, is grown over the pyramids. This oxide can be grown by dry oxidation (using $O_2$ gas). This oxide also can be grown by wet oxidation (using $H_2O$ generated from liquid water or reaction of $H_2$ and $O_2$), with environment temperature in the range of 900° C.-1000° C.

Next, after this protective layer of $SiO_2$ is formed, the mask material $SiO_2$ can be removed, for example, by plasma etching using fluorine-based gas, or by ion milling using Ar gas. As will be appreciated, the thickness of oxide on the sidewalls of the pyramid is less than that on the top. This is at least partially due to the fact that near the top, sidewalls from all sides are oxidized inward, toward the central axis. Near the very top, this inward oxidation will completely oxidize the silicon tip, thus resulting in a thicker $SiO_2$ top layer covering the newly formed silicon tip under the $SiO_2$ layer. Additionally, etching rate of $SiO_2$ on the sidewalls tends to be higher than that on the top. As a result, after a period of etching, the oxide on the sidewalls will be removed, whereas on the apex some thickness of the $SiO_2$ layer still remains.

Figure 5:
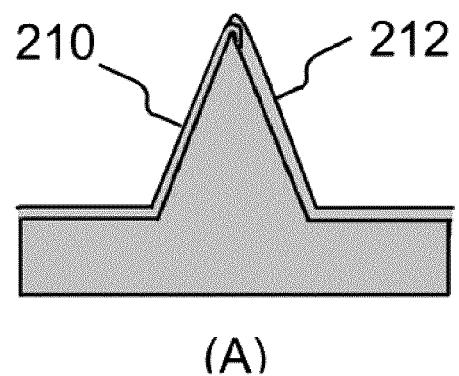
FIGS. 5A, 5B, and 5C are diagrams illustrating steps of an alternative method of covering the apex area of a pyramid-shaped protuberance.
Figure 5:
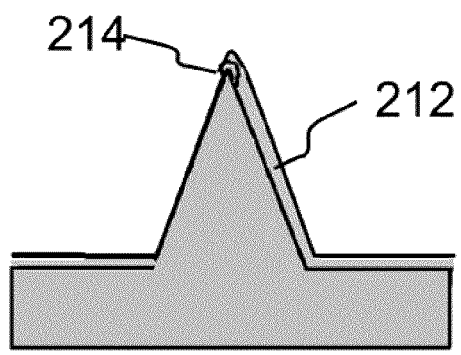
Figure 5:
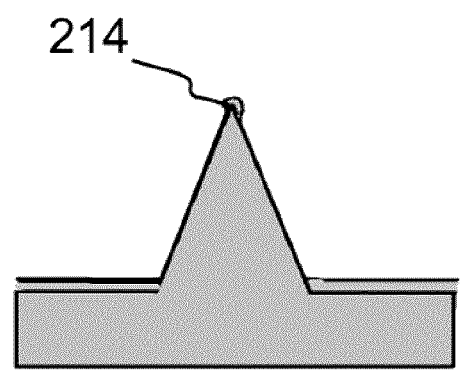

Referring to FIG. 5A to FIG. 5C, yet another different method of covering apex 108 with mask material is described. More than one protective material is used to cover the pyramid structures according to this method. As a first step, one side of the pyramid structures is covered with a first coating material 210, such as Cr. The selection of the first coating material is still based on its high selectivity with respect to the substrate material, in this case silicon. To coat the first coating material from only one direction (may be one sidewall or several), the substrate is evaporation coated in high vacuum so that the deposition generally follows the "light of sight" manner. The vacuum only needs to be sufficiently high to permit light-of-sight deposition. In such a vacuum, by tilting the substrate (i.e., altering the coating angle), Cr coating covers mostly the side or sides exposed to the Cr coating stream. In a similar manner, the remaining side (or sides), facing a generally opposite direction, is covered with a second coating material 212, such as Ti, to form a protective layer of Ti to cover the remaining uncovered portion of the pyramid. As will be appreciated, the top of a pyramid, i.e., the apex, is coated twice, with a layer of the first coating material, i.e., Cr, at the bottom, and a layer of the second coating material, i.e., Ti, on the top. The sidewalls, on the other hand, generally have only one protective layer of coating material, either Cr or Ti, but not both.

Next, the layer of mask or coating materials are removed from the sidewalls to expose the sidewalls. The selection and coating of the second coating material is such that when the first coating material is removed from sidewalls by etching so that the underneath sidewall (or sidewalls) is exposed, an adequate thickness of layer of coating material(s) on the apex still remain. This may be achieved by, e.g., selecting a second coating material with higher selectivity, coating a thicker layer of second material, or both, or appropriate selection of etching time, so that when the first coating material is removed from the sidewalls with sidewalls covered by the first coating material now exposed, a protective layer or layers of coating material(s) still remain on the apex due to protection provided by the second coating material, even if the second coating material may have been partially or completely removed. In this example, a Ti layer that is thicker than the Cr layer is coated. As a result, the removal of Cr from sidewalls can be more complete with the exposed Ti layer still remaining on the apex. Consequently, the portion of Cr coating protected by the Ti coating, namely the Cr portion 214 on top of the apex that is under the Ti layer 212, is protected (FIG. 4B). Next, the Ti coating 212 is removed to expose the remaining portion of sidewalls covered by the Ti coating. It can be removed using dry etch, in a manner similar to removing Cr from sidewalls, or it can be removed using wet etch. After the coating materials are removed from the sidewalls so that the sidewalls are exposed, the apex of each pyramid structure is still coated by at least a Cr layer 214.

Here, the selection of the pair of hard mask materials is that one can find a plasma etching recipe that etches the first material (underneath and protected by the second material at the pyramid apex) much faster than the second one (this requirement can be relaxed if the layer of the first material is thinner than the layer of the second one), and the second material can be removed (e.g., using plasma etch or wet chemical etch) without attacking the first material. The first material also must be a good mask material for etching the substrate material, such as silicon. Examples of such suitable pairs include Cr/Ti and Al/Si.

After hard masks 110, 214 are suitably formed on top of apexes of pyramids, the pyramid-shaped structures, now each having a hard mask formed on its apex, are etched simultaneously, or at least in a batch process, instead of one by one, to form the high aspect ratio pillars (FIG. 4D). Any one of various etching methods can be used. For a silicon substrate, including silicon wafers with oxide on each silicon apexes as masks, plasma produced from a fluorine-based gas, such as $SF_6/C_4F_8$ plasma, among others, is often a popular choice for etching silicon. Silicon can also be etched using cryogenic etch (cool substrate to below −100° C.) using $SF_6/O_2$ gas. Alternatively, Si can be etched using chlorine-based or bromine-based gas, such as $Cl_2$, $BCl_3$, or $Br_2$. Silicon can be etched readily by plasma etching, for example, in a (regular capacitively coupled plasma) reactive ion etching ("RIE") system. Inductively coupled plasma ("ICP") may be used. Thus one may also use an ICP-RIE method to etch the silicon anisotropically to form almost vertical sidewalls, with very high aspect ratio. The result is a silicon pillar or shaft right below the Cr mask, having along its length a transverse cross-sectional shape substantially defined by that of the Cr mask, or even generally the same as the shape of the Cr mask. In one example, the coated pyramids are etched in an ICP-RIE system for 0.5 min with $C_4F_8$ (38 sccm) and $SF_6$ (22 sccm) gases at 10 mT, 1200 W ICP and 20 W RIE power, to create high aspect ratio silicon pillar structures. This provides an etching rate of about 400 nm/min. At this etching rate and etching time, high aspect-ratio nano-tip probes with sub-8 nm radius and tip height of about 200 nm are formed on the pyramid base. This results in a shaft or pillar with an aspect ratio that is at least 200 nm/16 nm≥10, on top of a pyramid base that has a much lower aspect ratio. Thus, a pillar, formed unitarily and integrally with the silicon substrate, has a high aspect ratio shaft and a low aspect ratio pyramid base between and joining the shaft and the silicon substrate. As will be appreciated, the height of the shaft or pillar is selectable through controlling etching rate and etching time. Thus, the aspect ratio of the pillar or shaft is also selectable by controlling etching rate and etching time.

Such high aspect ratio of the tips is made possible by the hard mask, i.e., the Cr coating, which provides very high selectivity with respect to $SF_6/C_4F_8$ plasma. Because of the high selectivity, the thin layer of Cr coating (less than 10 nm thick in this example due to previous etching to remove sidewall covering) is adequate for protecting the apex from Si etching while the sloped sidewalls of the pyramid structures are etched away by the $SF_6/C_4F_8$ plasma. The size of the mask left on top of the pyramids, among others, directly affects the size, or diameter, of the silicon pillar or shaft formed in the silicon etching step. The thickness of the mask and selectivity of the mask material, on the other hand, determines the maximum height possible for the formed silicon pillar or shaft of the probe. For example, to produce a pillar of longer shaft (e.g., longer than 200 nm in this example) will require a mask material with higher selectivity or a thicker mask, or both, than described in the example above.

Of course, one skilled in the art will appreciate that if the initial coating is thicker, e.g., thicker than 10 nm, then it takes longer to remove the Cr coating from the sidewalls and vice versa. This also will lead to a different size of the mask, i.e., the size of Cr islands left on top of pyramids. Additionally, the yield curve is metal- (here Cr) and gas-dependent (here Ar). An appropriate selection of initial thickness therefore will need to take into account the yield curve, the incidence angle θ, and the height and final diameter of the fabricated probe, so that after the sidewall coating is removed to expose the sidewalls, a mask of adequate thickness and size still remains. It is found that for Cr, the thickness of Cr coating of 10 nm is suitable for forming silicon pillars of diameter around 15 nm.

Figure 2:
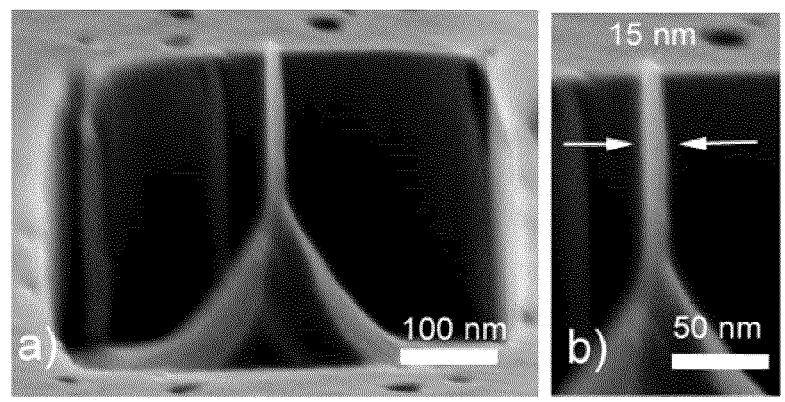
FIG. 2 shows scanning electron microscope ("SEM") photographs of silicon pillars fabricated from pyramid-shaped protuberances shown in FIG. 1.
Figure 3:
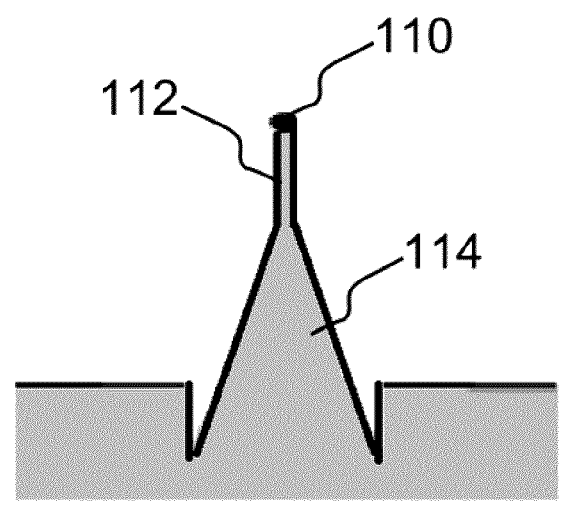
FIG. 3 is a diagram illustrates a silicon pillar shown in the photographs of FIG. 2.

FIG. 2 shows examples of SEM micrographs of high-aspect-ratio silicon pillars fabricated using this process. In one example, one starts from a 4" wafer with, for example, 380 pyramids to form an array of 380 such pillars, i.e., with a density of at least about 380 pillars per 78 $cm^2$ (about $\pi \times 5^2$ $cm^2$), or at least about 480 pillars per 100 $cm^2$.

Figure 6:
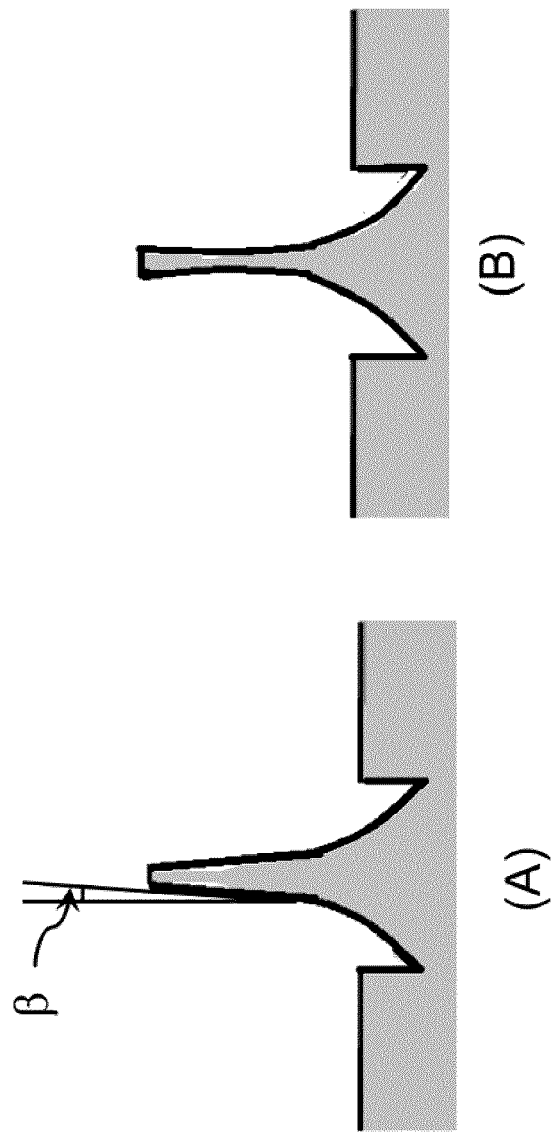
FIG. 6A illustrates in a diagram a tapered shaft of a silicon pillar fabricated using the method described herein and FIG. 6B illustrates in a diagram a shaft of a silicon pillar with a thinner middle section.

Shaft 112 of the pillar may be tapered towards the tip, i.e., the apex area, as illustrated in FIG. 6A. For better mechanical property, a sidewall angle β, i.e., the angel between the sidewall and the longitudinal axis of the shaft, of 3-5 degrees is desirable. This can be achieved by modifying Si etching recipe, such as the balance of chemical etching by $SF_6$ and passivation by $C_4F_8$. Similarly, the Si etching recipe also can be modified to produce probes with shaft that has a middle section that is thinner than both ends, as illustrated in FIG. 6B.

After the silicon etching step, depending on the mask thickness, selectivity of the mask material and the pillar height etched, some mask material may remain on the top of the etched pillar, thus providing a pillar-like structure that has a cap of mask material at the top of the pillar or shaft, with the pillar or shaft extending between the cap and the low aspect ratio base. This cap may be removed in a wet etch process, if desirable.

Figure 7:
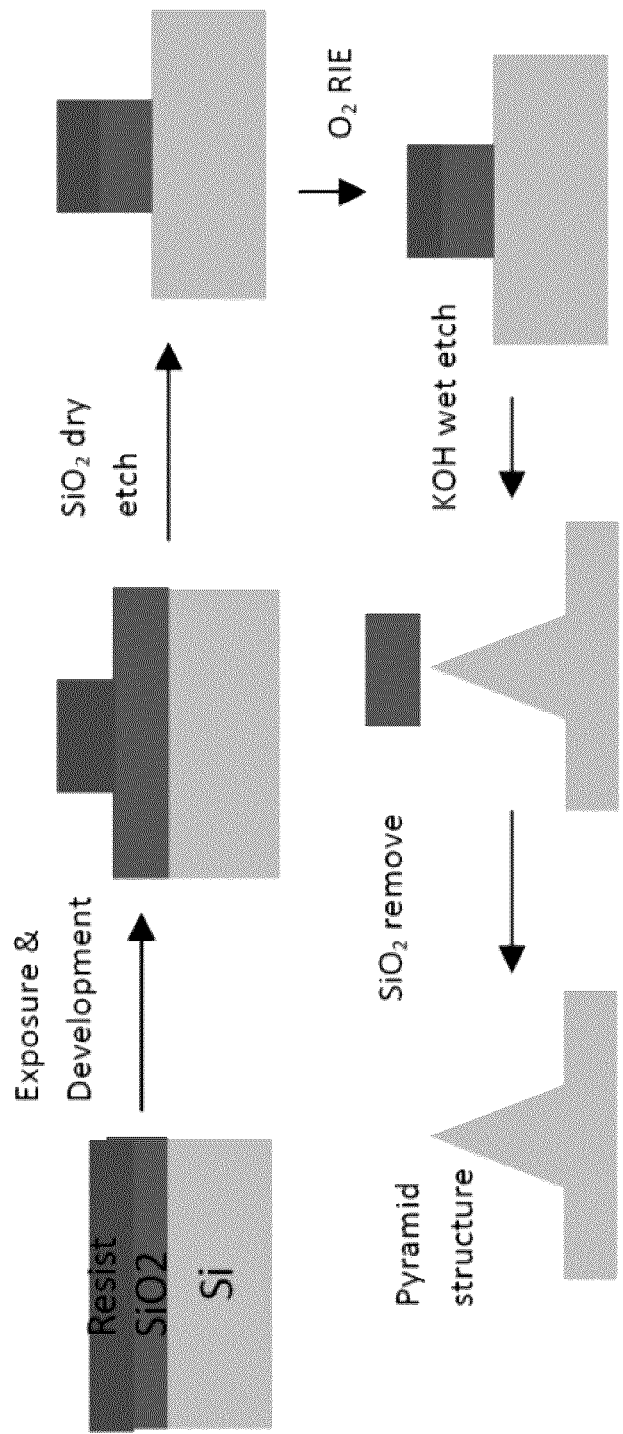
FIG. 7 is a process diagram illustrating steps of a method of forming multiple pyramid-shaped structures on a flat substrate for use of fabricating an array of pillars using the batch processing method described herein.

As described earlier, any substrate of a suitable material, such as silicon, with an array of pyramid-shaped protuberances may be used for fabricating the array of pillars or other shaped structures, including these substrates available commercially. Such a substrate, of course, also may be made from a flat substrate. FIG. 7 shows major steps of a method of fabricating such a substrate with an array of protuberances formed thereon from a flat substrate.

According to this method, a silicon wafer {100} with oxide of a thickness of about 180 nm is solvent cleaned and then spun-coated a layer of polystyrene ("PS") that has a thickness of about 300 nm. This polystyrene is a mixture of two different molecular weights, to make an equivalent 550 kg/mol (broad distribution) polystyrene on Si. Next, at an exposure and development step, square arrays are exposed on $PS/SiO_2$ at 20 KeV with 0.306 nA beam current. After developing with tetrahydrofuron for 1 min the pattern is transferred to $SiO_2$ layer by dry etching $SiO_2$ and Si with $CHF_3$ gas using PS as an etching mask. After oxygen plasma RIE cleaning of any possible fluorocarbon polymer, KOH (20 w/V %) wet anisotropic etching is performed at about 50° C. for 11 min to fabricate pyramid structure on flat silicon wafer. After the pyramid structures are formed on the silicon substrate, $SiO_2$ is removed using, for example, BHF.

Figure 8:
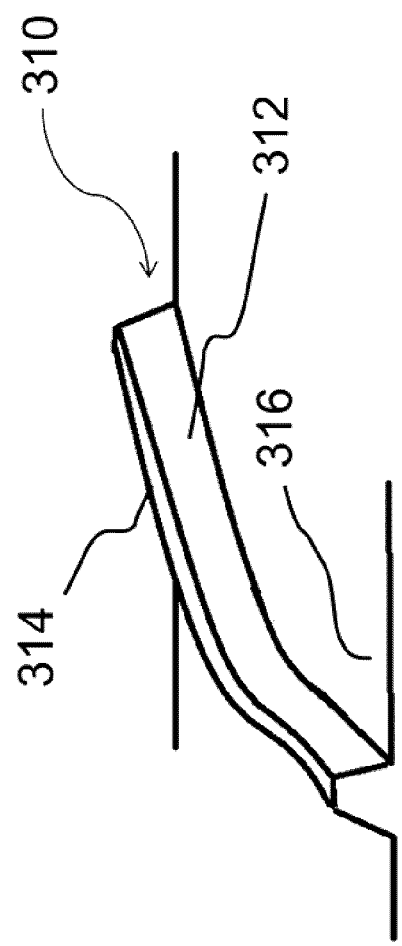
FIG. 8 is diagram illustrating a protuberance in the nature of a curved bank for manufacturing a nano-scale wall or a number of similarly shaped or differently shaped walls using the fabrication method described herein.

As will be appreciated, the reason that these protuberances all have similar regular shapes in the example described above is that the desired end product is an array of pillars, i.e., an array of pillars having the same high aspect ratio shafts. Therefore, individual protuberance, with similar shape and size, are formed on the silicon substrate. The protuberances may take any other shape. For example, a substrate may have formed thereon one or more protuberances. When more than one are formed on a substrate, they each may have similar or different shapes and sizes, as desirable or required by design. For example, FIG. 8 shows one such protuberance that takes the shape of curved bank 310 with sloped side surfaces 312. The substrate provides a base for the curved bank. Such a curved bank can be used as a precursor for fabricating curved, generally vertical walls. To fabricate the curved, generally vertical walls, the top or upper surface 314 of the curved bank is coated with hard mask material, such as Cr, thus defining the shape of eventually fabricated nano-scale structure. The hard mask may be formed by first evaporation coating the entire curved bank 310 to form a thin protective layer of Cr and then removing the protective layer of Cr from sloped side surfaces 312 of the bank 310 in the same way as removing Cr from sidewalls of pyramid structures, as described in connection with fabricating arrays of silicon pillars. This leaves a hard mask formed on top of the bank. After the suitable hard mask is formed, the top masked bank is Si etched to form substantially vertical walls extending from the hard mask on top of the bank and downwards towards the base surface 316. As will be appreciated, the vertical walls may be slightly tapered and not perfectly vertical. For example, the vertical wall may have a small sidewall angle β, formed in a manner similar to that forming the tapered pillars. The vertical walls may also be concaved, i.e., thinner in a portion below the top than the thickness at the top or toward the base. Further, if a curved bank takes some other shape, and the mask is formed accordingly on top of the bank, the resulting walls will follow the shape of the mask that is formed on top of the bank. Thus, walls following more complicated shapes, or micro/nano-structures having more complicated shapes, may be fabricated using the method described herein.

Various embodiments of the invention have now been described in detail. Those skilled in the art will appreciate that numerous modifications, adaptations and variations may be made to the embodiments without departing from the scope of the invention, which is defined by the appended claims. The scope of the claims should be given the broadest interpretation consistent with the description as a whole and not to be limited to these embodiments set forth in the examples or detailed description thereof.

What is claimed is:

1. A method of fabricating a plurality of pillar-like structures on a substrate, said substrate having a plurality of protuberances formed thereon, each of the protuberances having an apex and sidewalls extending downward from an apex area, said method comprising:
    forming a protective layer covering each protuberance of the plurality of protuberances with a mask material to cover at least the apex of the each protuberance;
    removing the protective layer of the mask material from sidewalls of the each protuberance to expose the sidewalls and leave an island of the mask material covering the apex to form a mask on the apex of the each protuberance; and
    etching each of the protuberances anisotropically with an etchant gas in a batch process to form the plurality of pillar-like structures, each pillar-like structure being etched from one of the protuberances and having a shaft extending from the mask towards the substrate, the shaft having along its length a transverse cross-sectional shape substantially defined by the shape of the mask.

2. The method of claim 1, wherein the substrate material is silicon and the etchant gas is one of a fluorine-based gas, a chlorine-based gas and a bromine-based gas.

3. The method of claim 1, wherein the etching of the each protuberance is by a plasma process.

4. The method of claim 3, wherein the plasma process is an ICP-RIE process.

5. The method of claim 4, wherein the substrate material is silicon, the mask material is Cr and the plasma is a $SF_6/C_4F_8$ plasma.

6. The method of claim 5, wherein the mask material Cr is evaporation coated and the removal of the coated Cr from the sidewalls is by physical sputtering with Ar ions.

7. The method of claim 4, wherein the mask material is Al and the gas used in the ICP-RIE process to remove the coated Al from the sidewalls is one of $Cl_2$ and $BCl_3$.

8. The method of claim 1, wherein the protective layer of the mask material on the sidewalls is removed using reactive ion etching with Ar gas.

9. The method of claim 8, wherein the protective layer of the mask material is removed from the sidewalls with Ar ions at such energy that physical process dominates the reactive process.

10. The method of claim 9, wherein the Ar ions are streamed toward the sidewalls of the protuberance at an incidence angle between 15 degrees and 40 degrees.

11. The method of claim 1, wherein the mask material is one of a metal or $SiO_2$.

12. The method of claim 11, wherein the protective layer of $SiO_2$ is formed by oxidization of silicon.

13. The method of claim 11, wherein the metal is selected from the group consisting of Cr, Ti, Ni, and Al.

14. The method of claim 1, wherein the protective layer of the mask material on the sidewalls is removed using a predominantly physical process.

15. The method of claim 14, wherein the protective layer of the mask material on the sidewalls is removed using one of ion milling, chemically assisted ion beam etching, or plasma etching.

16. The method of claim 1, further comprising:
covering each of the plurality of protuberances with a protective layer of second mask material after covering the plurality of protuberances with the mask material, the protective layer of the second mask material covering at least the mask material that covers the apex of the each protuberance, and
removing the protective layer of second mask material from sidewalls of the each protuberance to expose sidewalls covered by the second mask material after removing the coated mask material from the sidewalls.

17. The method of claim 16, wherein the mask material and the second mask material pair is either Cr/Ti or Al/Si.

18. The method of claim 16, wherein the second mask material is more resistive to removal than the mask material with respect to a gas ion used for removing the protective layer of the mask material from sidewalls of the pyramids.

19. The method of claim 16, wherein the protective layer of the second mask material is formed thicker than the protective layer of the mask material.

20. The method of claim 1, wherein the mask material has a selectivity of at least 1:10 with respect to the substrate material when etching with the etchant gas.

21. The method of claim 1, wherein the shaft has a shaft aspect ratio, the shaft aspect ratio being selectable by controlling etching rate and etching time at the step of etching the protuberances.

22. The method of claim 21, wherein the shaft aspect ratio is selected to be least 10.

23. The method of claim 1, wherein size of the transverse cross-sectional area is selectable by controlling size of the mask.

24. The method of claim 23, wherein the size of the mask is controlled by selecting thickness of the protective layer of the mask material covering the each protuberance and etching time applied to remove the protective layer of the mask material from the sidewalls.

25. A method of fabricating a nano-scale structure on a substrate, said substrate having at least one protuberance formed thereon, the at least one protuberance having a top surface defining the shape of the nano-scale structure and sloped sidewalls extending downward from the top surface, said method comprising:
forming a protective layer covering the at least one protuberance with mask material to cover at least the top surface;
removing the protective layer of the mask material from sidewalls of the at least one protuberance to expose the sidewalls and to form a mask covering the top surface of the at least one protuberance;
simultaneously etching the sloped sidewalls of the at least one protuberance anisotropically with an etchant gas to form substantially vertical walls extending from the mask toward the substrate, each of the substantially vertical walls being etched from one of the sloped sidewalls.

26. The method of claim 25, wherein the mask material has a selectivity of at least 1:10 with respect to the substrate material when etching using the etchant gas.

27. The method of claim 25, wherein the mask material is a metal.

28. The method of claim 25, wherein the mask material is selected from the group consisting of Cr, Ti, Ni, Cu, Al, and $SiO_2$.

29. The method of claim 28, wherein the protective layer of $SiO_2$ is formed by oxidization of silicon.

30. The method of claim 25, wherein the mask material is Cr and the mask material on the sloped sidewalls is removed using dry etch with Ar gas.

31. The method of claim 25, wherein the substrate material is silicon and the etchant gas is one of a fluorine-based gas, a chlorine-based gas and a bromine-based gas.

* * * * *